United States Patent
Wang et al.

(10) Patent No.: US 11,165,365 B1
(45) Date of Patent: Nov. 2, 2021

(54) RF POWER RECTIFIER CIRCUIT

(71) Applicant: Beken Corporation, Shanghai (CN)

(72) Inventors: Xingyu Wang, Shanghai (CN); Jiazhou Liu, Shanghai (CN)

(73) Assignee: Beken Corporation, Shanghai (CN)

( * ) Notice: Subject to any disclaimer, the term of this patent is extended or adjusted under 35 U.S.C. 154(b) by 0 days.

(21) Appl. No.: 16/949,108

(22) Filed: Oct. 14, 2020

(30) Foreign Application Priority Data

Sep. 16, 2020 (CN) .......................... 202010973503.2

(51) Int. Cl.
| | | |
|---|---|---|
| *H03F 3/189* | (2006.01) | |
| *G05F 3/26* | (2006.01) | |
| *H02M 7/25* | (2006.01) | |
| *H02M 7/219* | (2006.01) | |

(52) U.S. Cl.
CPC ............. *H02M 7/25* (2013.01); *H02M 7/219* (2013.01)

(58) Field of Classification Search
CPC ... G05F 3/26; G05F 3/262; H03F 1/30; H03F 1/301; H03F 3/189; H03F 3/19; H03F 3/193; H03F 3/195; H03F 3/45; H03F 3/45071; H03F 3/45179
See application file for complete search history.

(56) References Cited

U.S. PATENT DOCUMENTS

| | | | | |
|---|---|---|---|---|
| 6,122,497 | A * | 9/2000 | Gilbert | H03D 7/1425 455/293 |
| 6,263,199 | B1 * | 7/2001 | Wortel | H03D 7/1441 455/313 |
| 2009/0267585 | A1 * | 10/2009 | Liu | H03F 3/45085 323/313 |
| 2010/0085030 | A1 * | 4/2010 | Inoue | G05F 3/24 323/312 |
| 2010/0321096 | A1 * | 12/2010 | Sudjian | H03F 1/301 327/530 |
| 2015/0244327 | A1 * | 8/2015 | Ding | H03F 3/193 330/291 |
| 2016/0380599 | A1 * | 12/2016 | Chen | H03F 3/45659 330/296 |

* cited by examiner

*Primary Examiner* — Gary L Laxton

(74) *Attorney, Agent, or Firm* — Scbwegman Lundberg & Woessner, P.A.

(57) ABSTRACT

A radio-frequency (RF) power rectifier circuit is provided. The RF power rectifier circuit includes a pair of differential voltage input nodes, a pair of input transistors respectively connected to the pair of differential voltage input nodes, a current mirror including a first, a second, and a third transistors, a pair of cascode transistors electrically connected between the pair of input transistors and the first transistor, a control resistor and a control transistor, and an output node. The control resistor is electrically connected to a source of the control transistor and the ground to provide a DC bias to the control transistor, and the control transistor is electrically connected to the second transistor to provide a dynamic bias to the pair of cascode transistors. This structure can lead to an increased input voltage range and reduced power consumption.

19 Claims, 2 Drawing Sheets

RF POWER RECTIFIER CIRCUIT

CROSS REFERENCE TO RELATED APPLICATIONS

This application claims priority to and incorporates by reference in its entirety Chinese patent application no. 202010973503.2, filed Sep. 16, 2020.

TECHNICAL FIELD

The present application relates to a rectifier circuit, particularly to a Radio Frequency (RF) power rectifier circuit.

BACKGROUND OF THE APPLICATION

RF power rectifier circuits are widely used in electronic devices such as power indicator circuits of RF transceivers for automatic gain control, linearity and offset compensation. Typically, the power indicator circuit may include a pre-amplification circuit, a RF power rectifier circuit, and a filter circuit, for example. Input voltage range and power consumption may greatly affect the performance of the power indicator circuit.

BRIEF DESCRIPTION OF THE APPLICATION

According to an embodiment, a radio-frequency (RF) power rectifier circuit may comprise a pair of differential voltage input nodes; a pair of input transistors respectively connected to the pair of differential voltage input nodes; a current mirror comprising a first, a second, and a third transistors; a pair of cascode transistors electrically connected between the pair of input transistors and the first transistor; a pair of cascode transistors electrically connected between the pair of input transistors and the first transistor; a control resistor and a control transistor; and an output node electrically connected to the third transistor to output the rectified voltage. The first transistor is configured to add input currents from the pair of input transistors into a combined current, and the second and the third transistors are respectively configured to proportionally replicate the combined current from the first transistor. The control resistor is electrically connected to a source of the control transistor and the ground to provide a DC bias to the control transistor, and the control transistor is electrically connected to the second transistor to provide a dynamic bias to the pair of cascode transistors.

According to an embodiment, a power indicator circuit may comprise a pre-amplification circuit, a radio-frequency (RF) power rectifier circuit, and a filter circuit that are electrically connected in series. The RF power rectifier circuit may comprise a pair of differential voltage input nodes; a pair of input transistors respectively connected to the pair of differential voltage input nodes; a current mirror comprising a first, a second, and a third transistors; a pair of cascode transistors electrically connected between the pair of input transistors and the first transistor; a control resistor and a control transistor; and an output node electrically connected to the third transistor to output the rectified voltage. The first transistor is configured to add input currents from the pair of input transistors into a combined current, and the second and the third transistors are respectively configured to proportionally replicate the combined current from the first transistor. The control resistor is electrically connected to a source of the control transistor and the ground to provide a DC bias to the control transistor, and the control transistor is electrically connected to the second transistor to provide a dynamic bias to the pair of cascode transistors.

According to an embodiment, a method of rectifying a voltage signal may comprise receiving differential input voltages with a radio-frequency (RF) power rectifier circuit, rectifying the differential input voltages by the RF power rectifier circuit to create a rectified output voltage; and outputting the rectified output voltage by the output node of the RF power rectifier circuit. The RF power rectifier circuit may include the pair of differential voltage input nodes; a pair of input transistors respectively connected to the pair of differential voltage input nodes; a current mirror comprising a first, a second, and a third transistors; a pair of cascode transistors electrically connected between the pair of input transistors and the first transistor; a control resistor and a control transistor; and an output node electrically connected to the third transistor to output the rectified voltage. The first transistor is configured to add input currents from the pair of input transistors into a combined current, and the second and the third transistors are respectively configured to proportionally replicate the combined current from the first transistor. The control resistor is electrically connected to a source of the control transistor and the ground to provide a DC bias to the control transistor, and the control transistor is electrically connected to the second transistor to provide a dynamic bias to the pair of cascode transistors.

BRIEF DESCRIPTION OF THE DRAWINGS

Non-limiting and non-exhaustive embodiments of the present application are described with reference to the following figures, wherein like reference numerals refer to like parts throughout the various views unless otherwise specified.

DETAILED DESCRIPTION OF THE ILLUSTRATED EMBODIMENTS

Various aspects and examples of the application will now be described. The following description provides specific details for a thorough understanding and enabling description of these examples. Those skilled in the art will understand, however, that the application may be practiced without many of these details.

Additionally, some well-known structures or functions may not be shown or described in detail, so as concise purpose and to avoid unnecessarily obscuring the relevant description.

The terminology used in the description presented below is intended to be interpreted in its broadest reasonable manner, even though it is being used in conjunction with a detailed description of certain specific examples of the application. Certain terms may even be emphasized below, however, any terminology intended to be interpreted in any restricted manner will be overtly and specifically defined as such in this Detailed Description section.

Without loss of generality, reference will be made to illustrative embodiments by taking a RF power rectifier circuit as example. Those of ordinary skills in the art understand that this is only to describe the application clearly and adequately, rather than limit the scope of the application, which is defined by the appended claims.

Figure 1:
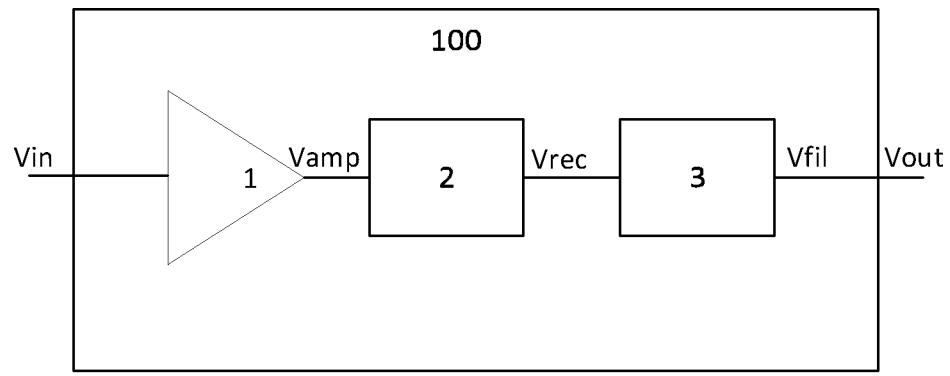
FIG. 1 is a circuit diagram illustrating a power indicator circuit including a RF power rectifier circuit according to an embodiment.

FIG. 1 is a circuit diagram illustrating a power indicator circuit 100 according to an embodiment. The power indicator circuit 100 of a RF transceiver (not shown in Figures) may include a pre-amplification circuit 1, a RF power rectifier circuit 2, and a filter circuit 3, which are all electrically connected in series, for example.

The pre-amplification circuit 1 is configured to pre-amplify an input voltage signal Vin and output a pre-amplified signal Vamp. The RF power rectifier circuit 2 is configured to receive and rectify the pre-amplified signal Vamp, and output a rectified signal Vrec. The filter circuit 3 is configured to receive and filter the rectified signal Vrec, and output a filtered signal Vfil as an output signal Vout, which can be used or further processed by another circuit (not shown in the Figures).

An input voltage range and power consumption of the RF power rectifier circuit 2 may greatly affect the performance of the power indicator circuit 100. Therefore, a new RF power rectifier circuit with an increased input voltage range and reduced power consumption becomes highly desirable.

Figure 2:
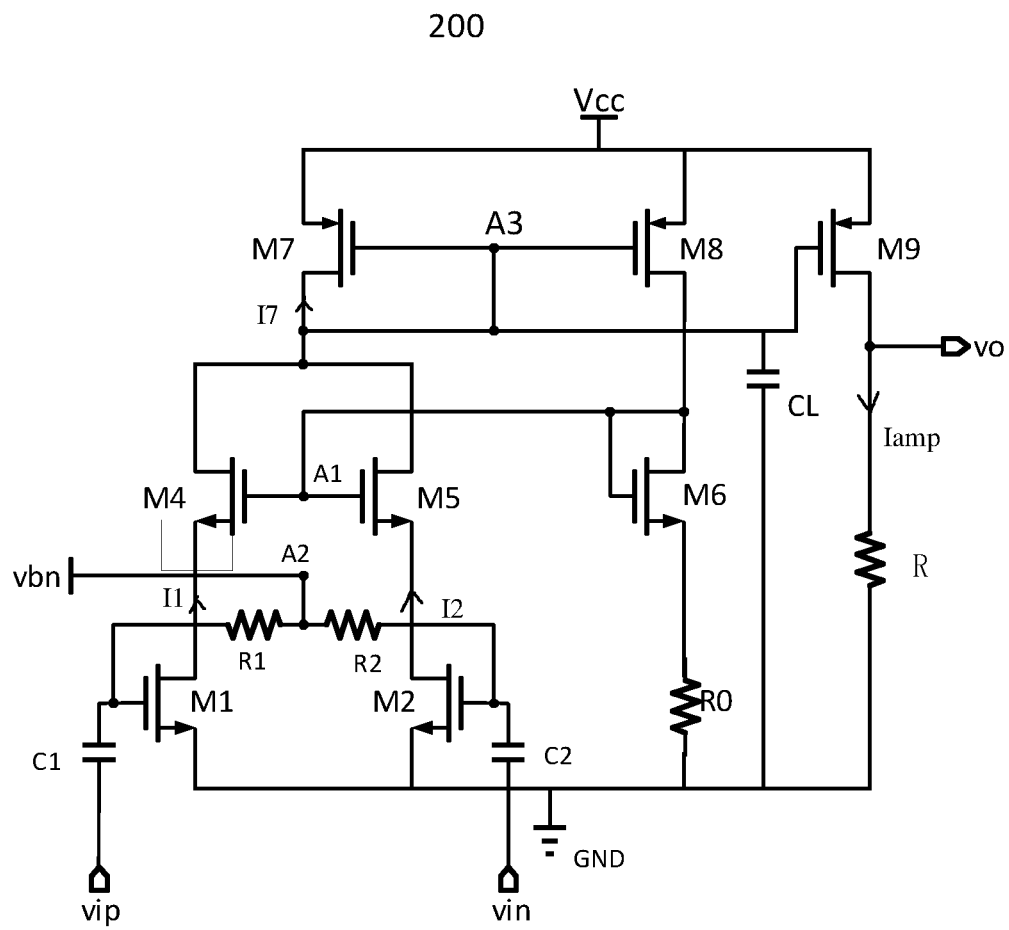
FIG. 2 is a circuit diagram illustrating a RF power rectifier circuit according to an embodiment.

FIG. 2 is a circuit diagram illustrating a RF power rectifier circuit 200 according to an embodiment. The RF power rectifier circuit 200 may include a pair of differential voltage input nodes (Vip, Vin) to receive a differential voltage input; a pair of input transistors or tubes (M1, M2) electrically connected to the pair of differential voltage input nodes (Vip, Vin); a current mirror including a first, a second, and a third transistors (M7, M8, M9); a pair of cascode transistors or tubes (M4, M5) electrically connected between the pair of input transistors and the first transistor (M7) of the current mirror; a control resistor and a control transistor (R0, M6); and an output node (Vo) electrically connected to the third transistor (M9) of the current mirror to output a rectified voltage.

A cascode transistor or tube can be a two-stage amplifier that includes a common-emitter stage feeding into a common-base stage for example.

The first transistor (M7) of the current mirror is configured to add input currents $I_1$ and $I_2$ respectively from the pair of input transistors (M1, M2) into a combined current $I_7$. The second and the third transistors (M8, M9) of the current mirror are respectively configured to proportionally replicate the combined current $I_7$ from the first transistor (M7).

The third transistor (M9) of the current mirror is electrically connected to a load resistor (R) and a capacitor (CL) to create a rectified voltage. For example, the third transistor (M9) of the current mirror can amplify the combined current $I_7$ of the first transistor (M7) of the current mirror into an amplified current $I_{amp}$, which flows through the load resistance (R), and then is converted into a voltage output at output node (Vo). The capacitor (CL) having a large capacity and the load resistor (R) may form a filter circuit that blocks high-frequency voltage signals from the gate of the third transistor (M9) of the current mirror, and only passes low-frequency voltage signals.

The control resistor (R0) is electrically connected between the ground and the control transistor (M6), and can provide a DC bias to the control transistor (M6). The control transistor (M6) is electrically connected to the second transistor (M8) of the current mirror and the pair of cascode transistors (M4, M5), and can provide a dynamic bias to the pair of cascode transistors (M4, M5). In this way, the second transistor (M8) of the current mirror can provide a dynamic bias to the pair of cascode transistors (M4, M5) via the control transistor (M6).

The pair of input transistors (M1, M2) may include a pair of NMOS input transistors. The first, the second, and the third transistors (M7, M8, M9) of the current mirror may include a first, a second, and a third PMOS transistors. The pair of cascode transistors (M4, M5) may include a pair of NMOS cascode transistors. The control transistor (M6) may include an NMOS control transistor. However, the types of the transistors (M1-M9) are not limited as listed above.

Work principles are explained with reference to FIG. 2 as follows.

In case that the amplitude of the input voltage signal is large (greater than a threshold value), the pair of input transistors (M1, M2) may work in the switching (on or off) state. The input voltage signal is converted by the pair of input transistors (M1, M2) into input currents $I_1$ and $I_2$ with the same polarity (positive or negative). The input currents $I_1$ and $I_2$ are added into a combined current $I_7$ at the drain of the first transistor (M7) of the current mirror. The combined current $I_7$ flows through the first transistor (M7) of the current mirror, and is amplified by the third transistor (M9) of the current mirror into an amplified current $I_{amp}$, which is converted by the load resistor (R) into a voltage signal to be output through the output node (Vo).

In case that the amplitude of the input voltage signal is small (less than the threshold value), the input currents $I_1$ and $I_2$ from the pair of input transistors (M1, M2) can be shown as follows:

$$I_1 = \frac{1}{2}K(Vbn + vip - Vth)^2, I_2 = \frac{1}{2}K(Vbn - vin - Vth)^2$$

Supposing vip−vin=vi=A*sine(ωt), then the combined current $I_7$ into the first transistor (M7) of the current mirror is shown as follows:

$$I_7 = I_1 + I_2 = \frac{K}{2}\left[(Vbn - Vth)^2 + \frac{vi^2}{2}\right] = I_{DC7} + \frac{K * vi^2}{4}$$

Here, the DC components can be expressed as $$I_{DC7} + \frac{K * A^2}{8}$$

Given the amplitude of the input voltage signal being small, the pair of cascode transistors (M4, M5) may limit the voltages at drains of the pair of input transistors (M1, M2), and thus may increase the input voltage range of the RF power rectifier circuit 200. With an increase of the voltage input signal, the input currents $I_1$ and $I_2$ from the pair of input transistors (M1, M2) may increase, such that the DC current of the second transistor (M8) of the current mirror may increase, a voltage level at the gates of the pair of cascode transistors (M4, M5) may increase, voltages levels at the drains of the pair of input transistors (M1, M2) may also increase, and thus the input currents $I_1$ and $I_2$ from the pair of input transistors (M1, M2) may further increase due to their channel length modulation (CLM) effect.

In this way, when an input voltage signal with a small amplitude is received by the RF power rectifier circuit 200, a positive feedback is formed in the circuit, and thus the transconductance of the circuit can be improved. When an input voltage signal with a large enough amplitude is received by the RF power rectifier circuit 200, the voltage level at the gates of the pair of cascode transistors (M4, M5) is close to a power supply, so that the pair of cascode transistors (M4, M5) work like a switch at a closed (or on) state, and thus does not affect the pair of input transistors (M1, M2). Therefore, the RF power rectifier circuit 200 may have an increased input voltage range and reduced power consumption.

In an embodiment, an end of the control resistor (R0) is electrically connected to the ground (GND), and another end of the control resistor (R0) is electrically connected to a source of the control transistor (M6). In this way, the control resistor (R0) may provide a DC bias to the control transistor (M6).

In an embodiment, a gate and a drain of the control transistor (M6) are electrically connected to a drain of the second transistor (M8), and a gate and a drain of the control transistor (M6) are electrically connected gates of the pair of cascode transistors (M4, M5) at a common point A1 for example. In this way, the second transistor (M8) may provide a dynamic bias to the pair of cascode transistors (M4, M5) via the control transistor (M6).

In an embodiment, the pair of input transistors (M1, M2) are electrically connected to the bias circuit (vbn) via a pair of resistors (R1, R2). Sources of the pair of input transistors (M1, M2) can be grounded.

In an embodiment, a pair of capacitors (C1, C2) are respectively connected between the pair of differential voltage input nodes (Vip and Vin) and the pair of input transistors (M1, M2) to block a DC input signal. A pair of resistors (R1, R2) are respectively connected between the bias circuit (vbn) and gates of the pair of input transistors (M1, M2).

In an embodiment, the bias circuit (vbn) is electrically connected to the pair of resistors (R1, R2) at a common point A2 for example.

In an embodiment, sources of the first, the second, and the third transistors (M7, M8, M9) of the current mirror are commonly connected to a power supply (Vcc). Gates of the first, the second, and the third transistors (M7, M8, M9) of the current mirror are commonly connected to drains of the pair of cascode transistors (M4, M5) at a common point A3 for example.

In an embodiment, the load resistor (R) is electrically connected between a drain of the third transistor and the ground, and the capacitor (CL) is electrically connected between a gate of the third transistor and the ground (GND).

Figure 3:
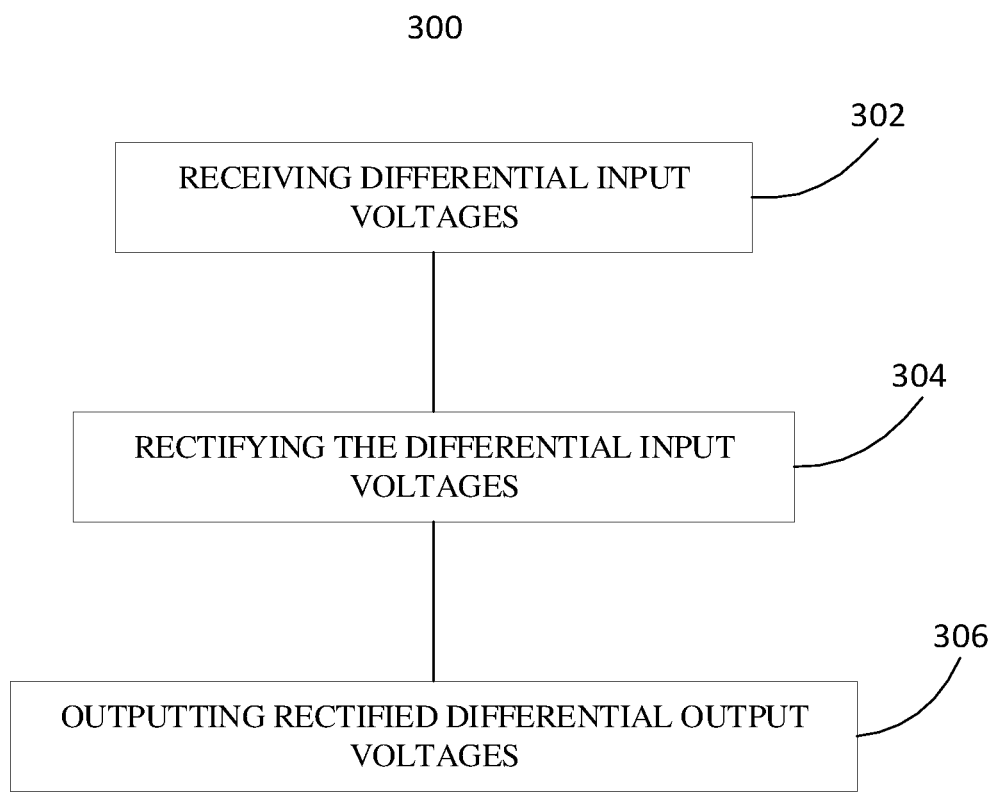
FIG. 3 is a flow chart illustrating a method of rectifying a voltage signal according to an embodiment.

FIG. 3 is a flow chart illustrating a method 300 of rectifying a voltage signal by using a RF power rectifier circuit (e.g., the RF power rectifier circuit 200 as shown in FIG. 2) according to an embodiment. As shown in FIG. 2, the RF power rectifier circuit 200 may include a pair of differential voltage input nodes (Vip, Vin) to receive differential input voltages; a pair of input transistors (M1, M2) electrically connected to the pair of differential voltage input nodes; a current mirror including a first, a second, and a third transistors (M7, M8, M9); a pair of cascode transistors (M4, M5) electrically connected between the pair of input transistors and the first transistor; a control resistor and a control transistor (R0, M6); and an output node (Vo) electrically connected to the third transistor to output a rectified voltage.

In an embodiment, in block 302, receiving differential input voltages with the pair of differential voltage input nodes (Vip, Vin) of the RF power rectifier circuit 200; in block 304, rectifying the differential input voltages by the RF power rectifier circuit to create a rectified output voltage; and in block 306, outputting the rectified output voltage by the output node (Vo) of the RF power rectifier circuit 200.

Features and aspects of various embodiments may be integrated into other embodiments, and embodiments illustrated in this document may be implemented without all of the features or aspects illustrated or described.

One skilled in the art will appreciate that although specific examples and embodiments of the system and methods have been described for purposes of illustration, various modifications can be made without deviating from the spirit and scope of the present application. Moreover, features of one embodiment may be incorporated into other embodiments, even where those features are not described together in a single embodiment within the present document. Accordingly, the application is described by the appended claims.

What is claimed is:

1. A radio-frequency (RF) power rectifier circuit comprising:
   a pair of differential voltage input nodes;
   a pair of input transistors respectively connected to the pair of differential voltage input nodes;
   a current mirror comprising a first, a second, and a third transistors, wherein the first transistor is configured to add input currents from the pair of input transistors into a combined current, and wherein the second and the third transistors are respectively configured to proportionally replicate the combined current from the first transistor;
   a pair of cascode transistors electrically connected between the pair of input transistors and the first transistor;
   a control resistor and a control transistor, wherein the control resistor is electrically connected to a source of the control transistor and the ground to provide a DC bias to the control transistor, and wherein the control transistor is electrically connected to the second transistor to provide a dynamic bias to the pair of cascode transistors; and
   an output node electrically connected to the third transistor to output the rectified voltage.

2. The RF power rectifier circuit of claim 1, wherein an end of the control resistor is electrically connected to a source of the control transistor.

3. The RF power rectifier circuit of claim 1, wherein a gate and a drain of the control transistor are electrically connected to a drain of the second transistor.

4. The RF power rectifier circuit of claim 1, wherein a gate and a drain of the control transistor are electrically connected gates of the pair of cascode transistors.

5. The RF power rectifier circuit of claim 1, wherein the pair of input transistors are electrically connected to the bias circuit through a pair of resistors.

6. The RF power rectifier circuit of claim 1, wherein sources of the first, the second, and the third transistors of the current mirror are commonly connected to a power supply.

7. The RF power rectifier circuit of claim 1, wherein gates of the first, the second, and the third transistors of the current mirror are commonly connected to drains of the pair of cascode transistors.

8. The RF power rectifier circuit of claim 1, wherein the third transistor is electrically connected to a load resistor (R) and a capacitor (CL) to create a rectified voltage.

9. The RF power rectifier circuit of claim 8, wherein the load resistor is electrically connected between a drain of the third transistor and a ground.

10. The RF power rectifier circuit of claim 8, wherein the capacitor is electrically connected between a gate of the third transistor and a ground.

11. The RF power rectifier circuit of claim 1, wherein another end of the control resistor and the pair of input transistors are commonly grounded.

12. The RF power rectifier circuit of claim 1, wherein a pair of capacitors are respectively connected between the pair of differential voltage input nodes and the pair of input transistors.

13. The RF power rectifier circuit of claim 1, wherein a pair of resistors are respectively connected between the bias circuit and gates of the pair of input transistors.

14. The RF power rectifier circuit of claim 1, wherein the pair of input transistors comprise a pair of NMOS input transistors, wherein the first, the second, and the third transistors comprise a first, a second, and a third PMOS transistors, and wherein the pair of cascode transistors comprise a pair of NMOS cascode transistors.

15. A power indicator circuit comprising a pre-amplification circuit, a radio-frequency (RF) power rectifier circuit, and a filter circuit that are electrically connected in series, wherein the RF power rectifier circuit comprises:
- a pair of differential voltage input nodes;
- a pair of input transistors respectively connected to the pair of differential voltage input nodes;
- a current mirror comprising a first, a second, and a third transistors, wherein the first transistor is configured to add input currents from the pair of input transistors into a combined current, and wherein the second and the third transistors are respectively configured to proportionally replicate the combined current from the first transistor;
- a pair of cascode transistors electrically connected between the pair of input transistors and the first transistor;
- a control resistor and a control transistor, wherein the control resistor is electrically connected to a source of the control transistor and the ground, and wherein the control transistor is electrically connected to the second transistor to provide a dynamic bias to the pair of cascode transistors; and
- an output node electrically connected to the third transistor to output the rectified voltage.

16. The power indicator circuit of claim 15, wherein an end of the control resistor is electrically connected to the ground, and wherein another end of the control resistor is electrically connected to a source of the control transistor.

17. The power indicator circuit of claim 15, wherein a gate and a drain of the control transistor are electrically connected to a drain of the second transistor of the current mirror, and wherein a gate and a drain of the control transistor are electrically connected gates of the pair of cascode transistors.

18. The power indicator circuit of claim 15, wherein the third transistor is electrically connected to a load resistor and a capacitor to create a rectified voltage.

19. A method of rectifying a voltage signal, comprising:
- receiving differential input voltages with a pair of differential voltage input nodes of a radio-frequency (RF) power rectifier circuit, the RF power rectifier circuit including:
  - the pair of differential voltage input nodes;
  - a pair of input transistors respectively connected to the pair of differential voltage input nodes;
  - a current mirror comprising a first, a second, and a third transistors, wherein the first transistor is configured to add input currents from the pair of input transistors into a combined current, and wherein the second and the third transistors are respectively configured to proportionally replicate the combined current from the first transistor;
  - a pair of cascode transistors electrically connected between the pair of input transistors and the first transistor;
  - a control resistor and a control transistor, wherein the control resistor is electrically connected to a source of the control transistor and the ground to provide a DC bias to the control transistor, and wherein the control transistor is electrically connected to the second transistor to provide a dynamic bias to the pair of cascode transistors; and
  - an output node electrically connected to the third transistor to output the rectified voltage;
- rectifying the differential input voltages by the RF power rectifier circuit to create a rectified output voltage; and
- outputting the rectified output voltage by the output node of the RF power rectifier circuit.

* * * * *